US009069918B2

(12) United States Patent
Poplack et al.

(10) Patent No.: US 9,069,918 B2
(45) Date of Patent: Jun. 30, 2015

(54) SYSTEM AND METHOD IMPLEMENTING FULL-RATE WRITES FOR SIMULATION ACCELERATION

(75) Inventors: Mitchell Poplack, San Jose, CA (US); Beshara Elmufdi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 878 days.

(21) Appl. No.: 12/814,337

(22) Filed: Jun. 11, 2010

(65) Prior Publication Data
US 2010/0318345 A1 Dec. 16, 2010

Related U.S. Application Data

(60) Provisional application No. 61/186,712, filed on Jun. 12, 2009.

(51) Int. Cl.
G06F 9/455 (2006.01)
G06F 17/50 (2006.01)
G06F 11/26 (2006.01)

(52) U.S. Cl.
CPC ........ *G06F 17/5022* (2013.01); *G06F 17/5045* (2013.01); *G06F 17/5027* (2013.01); *G06F 11/261* (2013.01)

(58) Field of Classification Search
None
See application file for complete search history.

(56) References Cited

U.S. PATENT DOCUMENTS

| 5,036,473 | A | 7/1991 | Butts et al. |
| 5,097,413 | A | 3/1992 | Mensch, Jr. |
| 5,109,353 | A | 4/1992 | Sample et al. |
| 5,475,830 | A | 12/1995 | Chen et al. |
| 5,551,013 | A | 8/1996 | Beausoleil et al. |
| 5,960,191 | A | 9/1999 | Sample et al. |
| 6,035,117 | A | 3/2000 | Beausoleil et al. |
| 6,051,030 | A | 4/2000 | Beausoleil et al. |
| 8,103,496 | B1 | 1/2012 | Roe et al. |
| 8,103,497 | B1 | 1/2012 | Nemecek et al. |
| 2004/0215442 | A1 * | 10/2004 | Musselman ............... 703/24 |
| 2005/0114113 | A1 * | 5/2005 | Quayle et al. ............. 703/25 |
| 2006/0089829 | A1 * | 4/2006 | Gooding et al. ........... 703/25 |

FOREIGN PATENT DOCUMENTS

EP 1845462 A1 * 10/2007

* cited by examiner

*Primary Examiner* — Omar Fernandez Rivas
*Assistant Examiner* — Bernard E Cothran
(74) *Attorney, Agent, or Firm* — Kaye Scholer LLP

(57) ABSTRACT

A system and method for writing simulation acceleration data from a host workstation to a hardware emulation system without considerably sacrificing emulation speed or sacrificing the emulation capacity available for a user's logic design. According to one embodiment, a system comprises a logic software simulator running on a host workstation; a hardware emulation system having a system bus and an emulator chip, the emulator chip includes: an emulation processor that generates emulation data, and a data array connected to the system bus; and a high-speed interface connecting the host workstation to the system bus of the hardware emulator, wherein simulation acceleration data from the host workstation are written to the data array of the emulator chip using the system bus.

20 Claims, 8 Drawing Sheets

Data Array Write Timing

| Step number mod 4 | Data Written |
|---|---|
| 0 (even) | Extra LUT |
| 1 (odd) | Emulation |
| 2 (even) | System Bus (i.e., Simaccel) |
| 3 (odd) | Emulation |

Fig. 7

SYSTEM AND METHOD IMPLEMENTING FULL-RATE WRITES FOR SIMULATION ACCELERATION

The present application claims the benefit of and priority to U.S. Provisional Patent Application No. 61/186,712 filed on Jun. 12, 2009, entitled "Method and System for Improving Simulation Acceleration," which is herein incorporated by reference.

FIELD

The present system and method relate to simulation acceleration, and particularly, to implementing full-rate write access for simulation acceleration.

BACKGROUND

Electronic design automation (EDA) tools are used for designing, verifying, and implementing electronic systems and component circuits. Within an electronic system, hundreds of integrated circuits, or "chips", may be interconnected on one or more printed circuit boards (PCBs). Today, an integrated circuit can easily comprise billions of interconnected transistors to enable a set of intended functions. Without EDA tools, it would be impractical, if not impossible, to produce and commercialize an integrated circuit of such complexity. Integrated circuits continue to become more complex (i.e., increasing number of transistors) with each successive generation of process technology, allowing more transistors to exist on a footprint of the same or smaller size. Increase in complexity generally translates to longer times for designing, verifying, and implementing a chip design. There exists a need for advances in EDA tool technology to keep chip development within a competitive timeline.

The design process for an integrated circuit generally entails describing the circuit's intended behavior at the register transfer level (RTL) using a hardware description language, such as VHDL, or Verilog, and then reducing the RTL design description into a physical layout of transistor gates. However, because the design is implemented to describe the functions of, perhaps, millions or billions of interconnected transistors, errors may be inevitable. Thus, the design needs to be verified to ensure that it behaves exactly the way the designers intended. One possible approach is to reduce the RTL code to a physical layout, fabricate a prototype chip, and then test it in the intended environment. However, the impracticality of such an approach goes without saying in the industry, given the turnaround time, the cost of manufacturing, and the number of design revisions that may be required to perfect the design.

Today, verification engineers utilize a range of EDA tool technologies for logic verification that are far more practical than prototyping. One such technology is software simulation, which refers to running an RTL design through a computer program, a "software simulator", on a general purpose computer or workstation to simulate the operations of the circuit design. Even though software simulation offers faster turnaround time compared to manufacturing an actual device, simulating a complex circuit design can still be painstakingly slow and can take up to months or more to finish. Indeed, it can take many hours or even several days to simulate just a small number of clock cycles of a typical design if a software simulator is used. This is because a typical workstation relies on a single processor to simulate these operations in a sequential or semi-sequential manner. In contrast, most of the operations on a fabricated chip are performed in parallel.

Hardware emulation is a logic verification technology that typically offers the fastest verification speed because a considerable number of operations may be performed in parallel. Parallel execution is achieved by mapping substantially the entire circuit design onto the emulation resources of a hardware platform. Additionally, with hardware emulation, the hardware platform can run almost independently from a workstation because almost all of the verification environment is placed on the hardware platform. Without having to wait for data input from the workstation, the user's design running in the emulator can operate at substantially full hardware speeds. However, the speed enhancement is not without cost. Because almost the whole design would need to be mapped onto the hardware platform, the complexity of the design is generally limited by the emulation resource capacity of the hardware platform.

Simulation acceleration offers a middle ground in terms of verification speed and emulation capacity between software simulation and hardware emulation by separately executing a software portion and a hardware portion of the design. Code apportionment is performed by a compiler in a workstation at compile time. The hardware portion of the design is mapped onto the emulation resources of the hardware emulation system, which executes the code in a substantially parallel manner, while the software portion of the design runs in the software simulator on the workstation. The workstation is connected to and works in conjunction with the hardware platform to verify the circuit logic through the exchange of simulation data. Because the hardware platform may have to wait for data input from the workstation, verification speed is determined in part by the percentage of the design remaining on the workstation and the communication channel width and latency between the workstation and the hardware platform.

SUMMARY

A system and method for writing simulation acceleration data from a host workstation to a hardware emulation system. According to one embodiment, a system comprises a logic software simulator running on a host workstation; a hardware emulation system having a system bus and an emulator chip, the emulator chip includes: an emulation processor that generates emulation data, and a data array connected to the system bus; and a high-speed interface connecting the host workstation to the system bus of the hardware emulator, wherein simulation acceleration data from the host workstation are written to the data array of the emulator chip using the system bus.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

FIG. 7 illustrates exemplary data array timing during even and odd steps.

Figure 1:
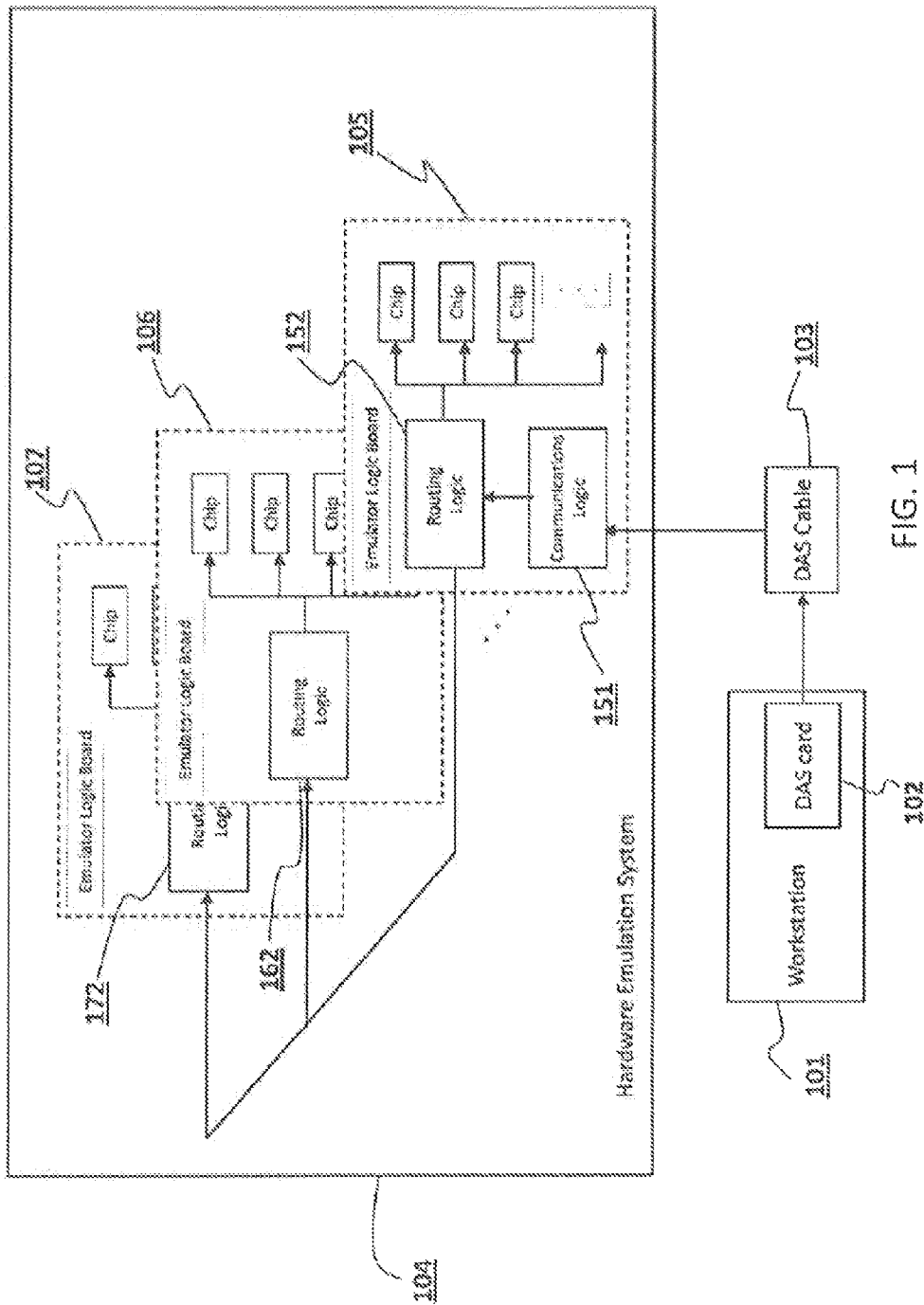
FIG. 1 illustrates a system of the related art for communicating simulation acceleration data to the hardware emulation system from the host computer.

Table 1 illustrates exemplary data array timing during even and odd steps.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do hot describe every aspect of the teachings disclosed herein and do not limit the scope of the claims.

DETAILED DESCRIPTION

Hardware emulation systems and simulation acceleration systems are collectively referred to as emulation systems in the subsequent sections. Such emulation systems are commercially available from various vendors, such as Cadence Design Systems, Inc. headquartered in San Jose, Calif.

Typical emulation systems utilize either interconnected programmable logic chips, or interconnected processor chips. Examples of hardware logic emulation systems using programmable logic devices are disclosed in, for example, U.S. Pat. No. 5,109,353, entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 5,109,353, 5,036,473, 5,475,830 and 5,960,191 are incorporated herein by reference. Examples of hardware logic emulation systems using processor chips are disclosed in, for example, U.S. Pat. No. 5,551,013 entitled "Multiprocessor for hardware emulation," U.S. Pat. No. 6,035,117 entitled "Tightly coupled emulation processors," and U.S. Pat. No. 6,051,030 entitled "Emulation module having planar array organization." U.S. Pat. Nos. 5,551,013, 6,035,117 and 6,051,030 are incorporated herein by reference.

Historically, the communication mechanism between the workstation and the hardware emulation system involved using a special communications card (e.g., a DAS card or a PdIISA card) that may be installed in a PCI slot on the workstation. The special communications card then connected to an emulator logic board of the hardware emulation system via a high-speed cable. Virtual communications logic was usually compiled into the user's emulated logic design to provide the machinery for the emulated logic to communicate with the simulator running on workstation.

FIG. 1 illustrates a system of the related art for communicating simulation acceleration ("simaccel") data to the hardware emulation system from the host workstation. Simulation acceleration data includes any data that may be needed by the hardware emulation processors for computation, such as data results outputted by a simulator. A host work station 101 is connected to a hardware emulation system 104 via a DAS cable 103. Particularly, the DAS cable 103 connects a DAS card 102 installed on the host workstation to an emulator logic board 105 on the hardware emulation system 104. Traditionally, there was no strobing or packeting mechanism to let the emulator logic board 105 know whether the simaccel data received from the host workstation 101 was valid. Instead, the hardware emulation system 104 would just sample the data every $n^{th}$ emulation cycle and take the data to be valid, the host workstation 101 was responsible for making sure that all the transmitted data were valid prior to the data being sampled. Virtual communications logic 151 and routing logic 152, compiled into the user's logic design, are emulated using the emulation resources (e.g., emulator chips) on emulator logic board 105. Communications logic 151 provides the mechanism for the simulator running on the workstation to communicate with the emulated logic design on the hardware emulation system and vice versa. Routing logic 152 provides the mechanism for delivering incoming simaccel data signals from the virtual logic 151 to other emulator chips that require the data signals. These emulator chips requiring the simaccel data signals may reside on emulator logic board 105 or on other emulator logic boards, such as boards 106 and 107. Routing logics 162 and 172 may also need to be emulated for routing the simaccel data signals received from emulator logic board 105 to emulator chips on emulator logic boards 106 and 107, respectively.

There are at least two significant drawbacks to this approach. One drawback is the fact that significant emulations resources are wasted in having to emulate virtual communications logic 151 and routing logics 152, 162, and 172. This reduces considerably the emulation capacity available for emulating the user's logic design. Another major drawback is the time it takes to route the simaccel data signals from the communications logic 151 to all the emulator chips requiring the data signals. Because the simaccel data signals are usually routed through a series of scheduled events, there are usually considerable time delays between when the data signals arrive at communications logic 151 and when the data signals are actually delivered to the emulator chips requiring the data signals. For instance, several emulation steps may be required to route a set of data signals from communications logic 151 to the routing logic 162. Another several emulation steps may be required to route the set of data signals received at routing logic 162 to emulator chips on the emulator logic board 106 requiring the data signals. These delays translate to a considerably slower emulated logic design.

In view of the foregoing, there exists a need for a system and method for communicating data from the host workstation to the hardware emulation system without considerably sacrificing emulation speed or sacrificing the emulation capacity available for a user's logic design.

Figure 2:
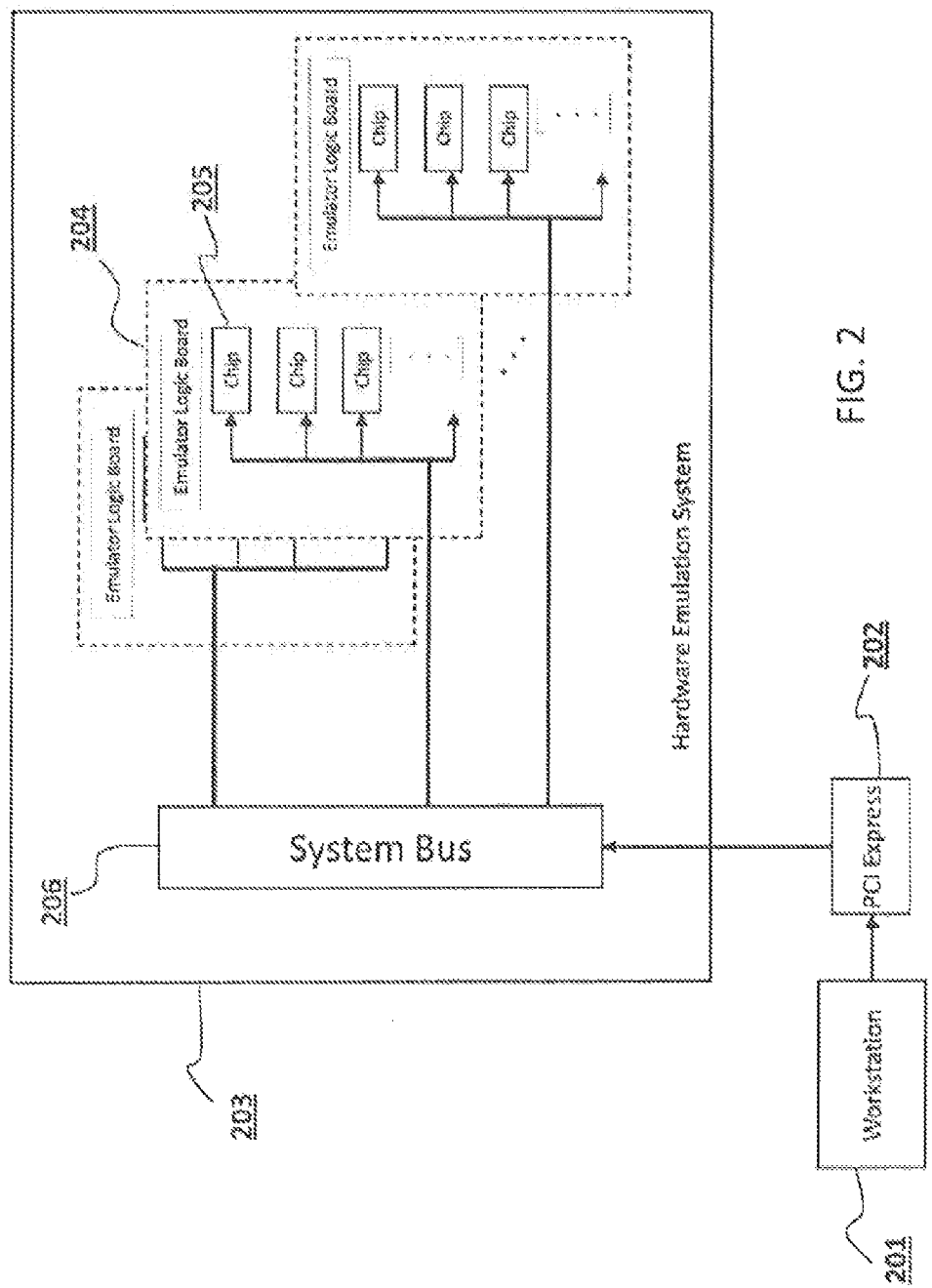
FIG. 2 illustrates an exemplary system for communicating simaccel data from a host workstation to hardware emulation system, according to one embodiment.
Figure 3:
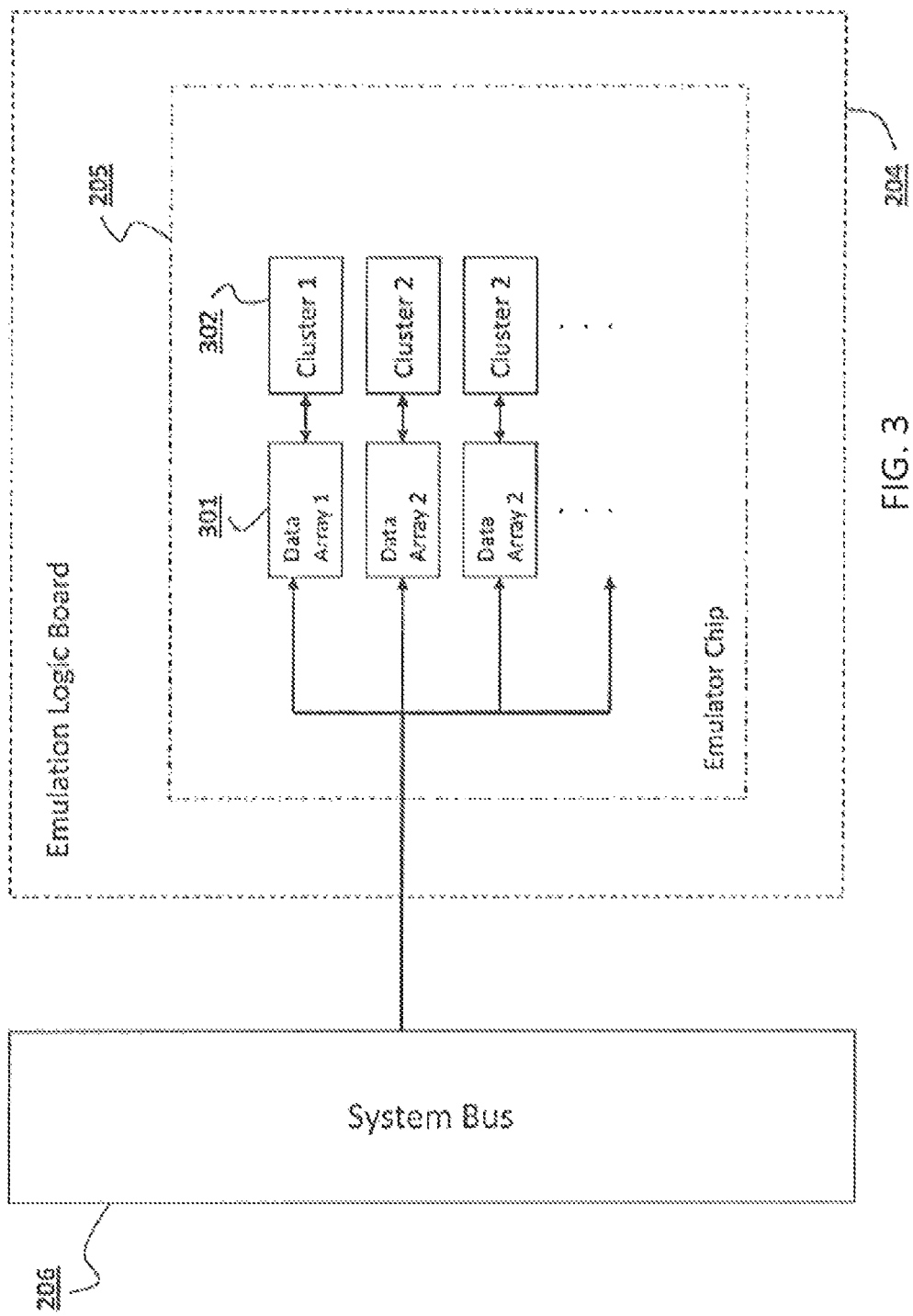
FIG. 3 then illustrates that the data arrays in each emulator chip are connected to the system bus.

The system and method presently disclosed allows the host workstation to communicate data to emulator chips on the same or on different emulator logic boards without considerably sacrificing emulation speed or sacrificing the emulation capacity (available for a user's logic design. FIG. 2 illustrates an exemplary system for communicating simaccel data from a host workstation 201 to hardware emulation system 203. Host workstation 201 is connected to the system bus 206 of the hardware emulation system 203 via a high-speed interface, such as a PCI Express card interface 202. As shown in FIG. 2, emulator logic boards 204 are connected to the system bus 206. Also shown is that the one or more emulator chips 205 on each emulator logic board 204 are connected to the system bus 206. FIG. 3 then illustrates that the data arrays 301 in each chip 205 are connected to the system bus 206. Thus, using the system bus 206, the host workstation can deposit simaccel data into an emulator chip 205 directly by writing data to the data arrays 301 of each processor cluster. This way, there are no unnecessary delays caused by having to move the data between emulator chips or between emulator boards. Data that are written to the data arrays 301 become readily accessible by corresponding processor clusters 302. Once an entire buffer of simaccel data has been written to a data array 301 by the simulator running on the host workstation, a predetermined data signal may also then be written to the data array 301 to indicate that the buffer of data is complete and valid.

Figure 4:
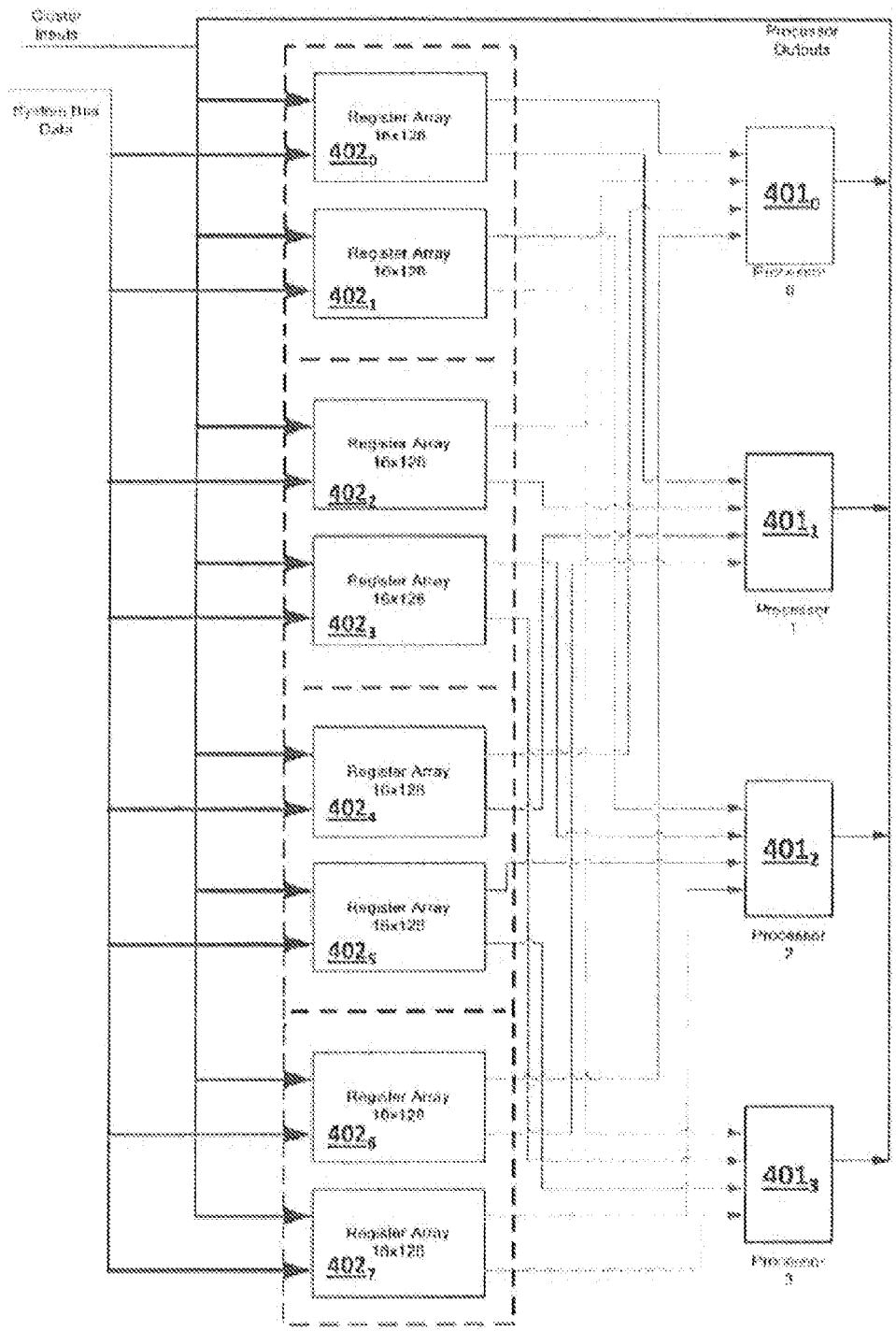
FIG. 4 illustrates an exemplary data array connected to a processor cluster having four processors.

FIG. 4 illustrates an exemplary data array 301 connected to a processor cluster having four processors $401_{0-3}$. The data array 301 may support random, single-bit reads. In other words, any one of the four processors $401_{0-3}$ can select and read out any single-bit value that is stored within data array 301. As shown, data array $301_1$ may be formed from eight 16×128 register arrays $402_{0-1}$, each register array $402_1$ having a single 16-bit write port and two single-bit read ports and storing identical information. This data array architecture provides 16 single-bit, random read ports to processors $401_{0-3}$. Other data array architectures that provide the 16 single-bit, random read ports are contemplated and may be sufficient. The eight register arrays $402_{0-7}$ may further be grouped into four pairs: $402_{0-1}$, $402_{2-3}$, $402_{4-5}$, and $402_{5-7}$. Each register array $402_1$ has two read ports for outputting to processors (e.g., selected single-bit value is driven on both read ports). The register arrays $402_{0-7}$ are arranged so that register array $402_0$ provides the first input to processors $401_0$ and $401_1$ while register array $402_1$ provides the first input to processors $401_2$ and $401_3$. The rest of the register arrays $402_{2-7}$ are also arranged in this fashion so that pairs of register arrays provide the same input to each of the processors $401_{0-3}$. By using this arrangement, each processor receives the same set of inputs such that data from each pair of register arrays may be accessible by each of the processors $401_{0-3}$.

During emulation, eight bits of emulation data may need to be written to the data array 301 at each step: four bits of cluster input and four bits of output generated by processors $401_{0-3}$ in the current step. Data from the function table (FTAB), which are used in the "Extra LUT" function, may also need to be written to the data array 301. However, as mentioned earlier, each data array 301 typically only has a single write port. To accommodate writing simaccel data from the system bus, in addition to writing all these other data, various types of data may be specified to be written at different times. For instance, emulation data may be written to the data array 301 during odd emulation steps and simaccel data and "Extra LUT" function data may be written to the data array 301 during even emulation steps. By partitioning various data writes into different write cycles, this arrangement eliminates the need for extra write ports, which often come at a premium in terms of layout space. Table 1 illustrates exemplary data array timing during even and odd steps. Alternatively, emulation data may be written during even steps while simaccel data and "Extra LUT" function data may be written during odd steps. A disclosure regarding "Extra LUT" functions may be found in U.S. patent application Ser. No. 11/541,285, which is incorporated herein by reference. Whether the simaccel data are written on even steps or on odd steps, the intended effect of providing full-rate writes to the data arrays 301 while the hardware emulation system is running remains the same.

Generally emulation data for writing to the data array 301 are pipelined. In other words, an emulation data value generated by processors $401_{0-3}$ in the current step m is not actually written to the data array 301 until step m+1. Instead, the emulation data value from step m is stored in a holding register, such as holding register $501_1$ shown in FIG. 5. If emulation data were written to the data array 301 every step instead of every other step, a single holding register may be sufficient. However, if emulation data are written to the data array 301 on every other step, a second holding register, such as holding register $501_2$ also shown in FIG. 5, may be needed. This is because two steps worth of emulation data need to be written at a time in order maintain the same emulation speed. Thus, a 16-bit write port is provided for writing two steps of emulation data (eight bits each step) to the data array 301 at a time. For example, emulation data values generated in the previous steps m−1 and m−2 are actually written to the data array 301 during odd step m. Thus, at least two holding registers (e.g. $501_1$ and $501_2$) may be needed to store emulation data values from steps m−1 and m−2 before they are written to the data array 301.

While processors $401_{0-3}$ typically read emulation data values from the data array 301, there may be instances in which processors $401_{0-3}$ need to read the emulation data values that are stored in the holding registers. Reading data values from the holding registers may be necessary either because these values have not yet been written to the data array 301 or because these values, although written to the data array 301, have not yet become accessible. To illustrate, consider the emulation data value generated by processors $401_{0-3}$ during odd emulation step m−2. Following the data array write timing of exemplary table 1, this value from step m−2 is not written to the data array 301 until the next odd step m. If the value from step m−2 is needed for computation at step m−1, the processors $401_{0-3}$ can either wait until the value is written to data array 301 or read the value from the corresponding holding register.

As stated earlier, processors $401_{0-3}$ may need to read emulation data values stored in the holding registers because these values are not yet accessible despite having been written to the data array 301. This scenario may occur as a result of a memory read/write constraint consistent with one exemplary embodiment. According to this embodiment, emulation data values may not be written to and read from the same location on the data array 301 during the same emulation step. In other words, even though emulation data from previous steps m−1 and m−2 have already been written to the data array 301 at odd step m, these data values that have just been written to the data array 301 may not be read by the processors $401_{0-3}$ until the next step m+1. Again, if the emulation data value from step m−2 or step m−1 is needed for computation by the processors $401_{0-3}$ at odd step m, the processors $401_{0-3}$ can either wait until step m+1, when the value becomes accessible, or read the value from the holding register. In such cases, a bypass logic may be implemented for selecting between reading values from the data array 301 and reading values from the holding registers. This way, the processors $401_{0-3}$ do not have to wait idly for data and thereby throttle the overall emulation speed.

Figure 5:
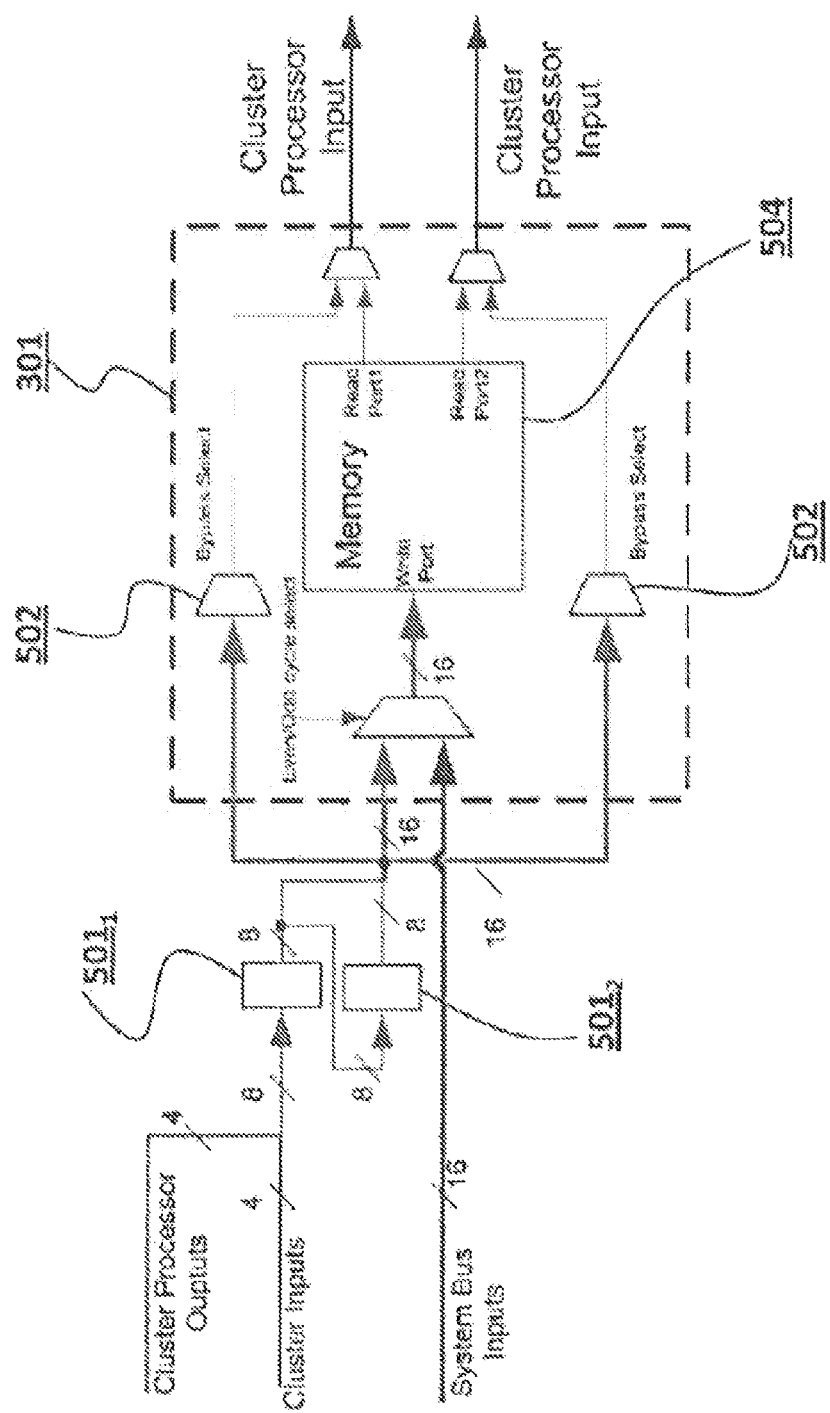
FIG. 5 illustrates an exemplary implementation of a register array that includes bypass logic for allowing emulation data values stored in the holding registers and to be outputted to the processors.

FIG. 5 illustrates an exemplary implementation of a register array 504 that includes bypass logic for allowing emulation data values stored in the holding registers $501_1$ and $501_2$ to be outputted to the processors $401_{0-3}$. As FIG. 5 illustrates, emulation data signals comprising four bits of cluster processor outputs and four bits of cluster processor inputs are connected as inputs to holding register $501_1$. Holding registers $501_1$ and $501_2$, each 8-bit wide, are connected serially such that the output of $501_1$ is connected to the input of $501_2$. This arrangement allows emulation data values to propagate from holding register $501_1$ to holding register $501_2$. To illustrate, consider the emulation data value generated at an odd emulation step m−2, which is then stored in holding register $501_1$.

At the next emulation step (i.e., even) m−1, the data value that was stored in holding register $501_1$ (i.e., value from step m−2) is outputted to and stored in holding register $501_2$. This frees up holding register $501_1$ for storing the emulation data generated in that current step (i.e., step m−1). At the next step (i.e., odd) m, the data values in holding registers $501_1$ and $501_2$ are then written to the data array 301 as a 16-bit value through the mechanism described below.

The 8-bit outputs of holding registers $501_1$ and $501_2$ and the 16-bit system bus input are connected as inputs to an even/odd step selector (i.e., mux) 503. During an even (or odd, depending on the configuration) emulation step, the selector 503 writes the 16-bit system bus input to the write port of the register array 504. During an odd (or even, depending on the configuration) step, the selector 503 writes the 8-bit data values stored in holding registers $501_1$ and $501_2$ to the write port of the register array 504. This allows the two sets of data signals to share the one 16-bit write port on the register array 504. As shown, the 8-bit outputs of the holding registers $501_1$ and $501_2$ are also connected to two bypass selects 502. A single bit from the two 8-bit data values (16 bits combined) stored in holding registers $501_1$ and $501_2$ is selected as the output for both the bypass selects 502. The output of each bypass select 502 is muxed with a read port of the register array 504. This allows the cluster processor inputs to be selected between data stored in the holding registers $501_1$ and $501_2$ and data stored in the register array 504.

Figure 6B:
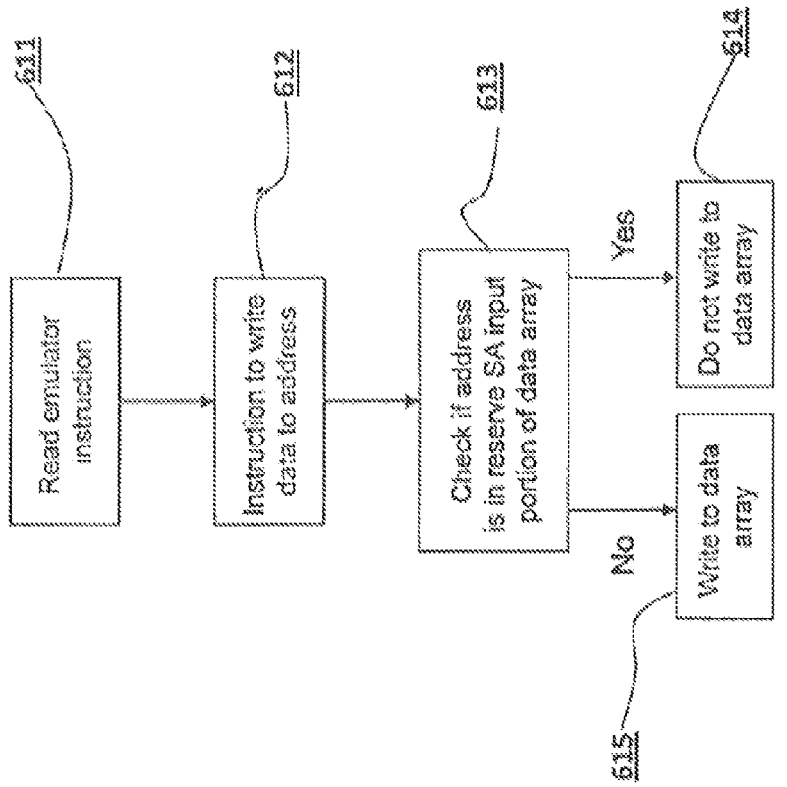
FIGS. 6a-6c illustrate exemplary implementations of a mechanism to ensure that the designated address range does not become overwritten with emulation data as the emulation processors step through the user's logic design.
Figure 6A:
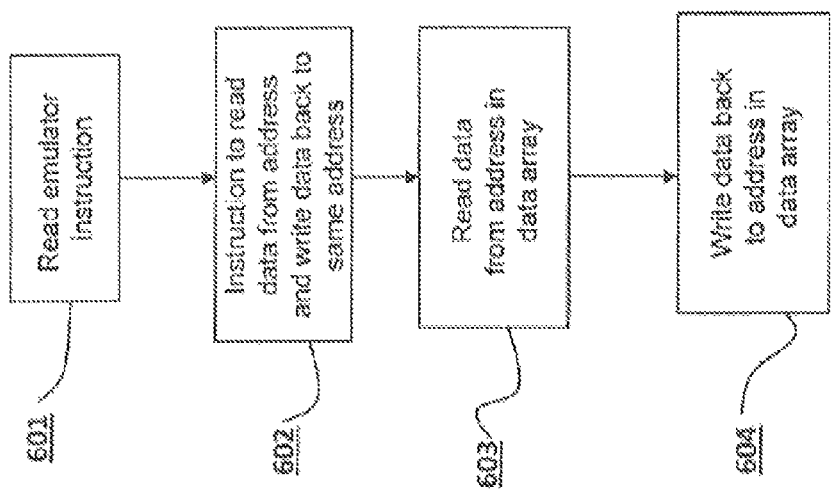
Figure 6C:
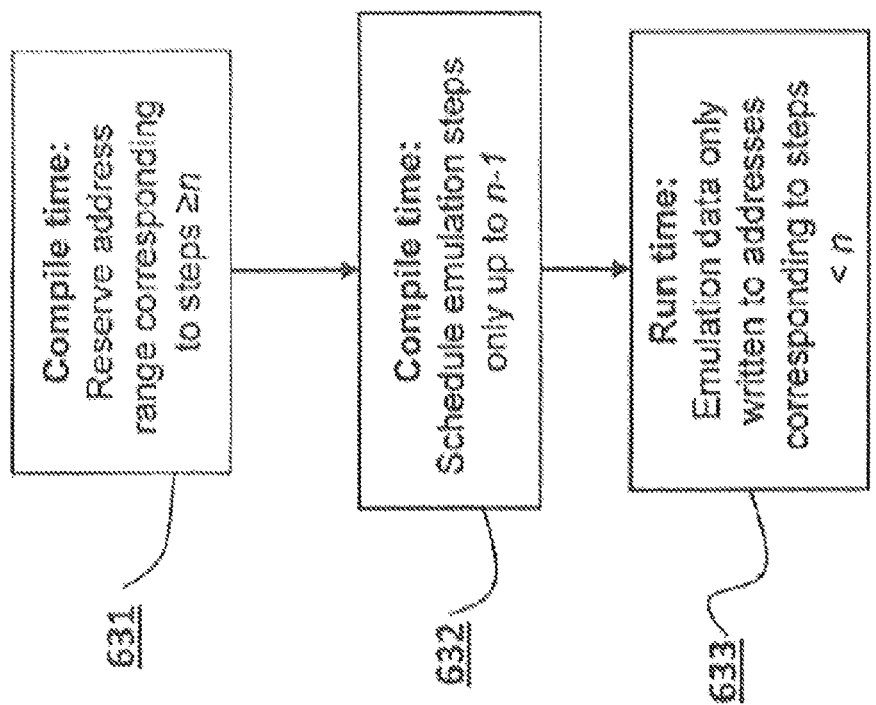

To avoid overwriting simaccel data by emulation data, an address range in the data array 301 may be designated for storing simaccel data. However, because the address location for writing emulation data to the data array 301 increments with the emulation step (i.e., sequential write), a mechanism may be needed to ensure that the designated address range does not become overwritten with emulation data as the emulation processors step through the user's logic design. FIGS. 6a-6c illustrate exemplary implementations of such a mechanism. As FIG. 6a illustrates, a processor reads the instruction from the control store. A control store is used to hold processor instructions, which are statically determined at compile time. The processor first reads the instruction at 601. Following the instruction 602, the processor reads the data from the address corresponding to the current step at 603, and then writes the same data back to the same address location. FIG. 6b illustrates another approach. The processor reads the instruction at 611. The instruction at 612 contains an instruction to write data to the data array. The processor is instructed to check whether the current address, which corresponds to the current step, is in the reserved address range at 613. If the current address is within the reserved address range, the processor does not write to the current address location on the data array at 614. Otherwise, the processor just writes to the current address on the data array at 614. FIG. 6c illustrates another alternative approach for reserving data storage space on the data array. During compile time at 631, the scheduler reserves an address range that corresponds to emulation steps equal to or greater than step n. The scheduler then schedules emulations steps only up to n−1 at 632. This way, steps equal to or greater than n are not executed and the data in the reserved address range do not become over written. During run-time at 633, emulations steps only increment up to n−1 and data are only written to addresses corresponding to emulation steps below step n.

Embodiments and methods as described herein have significant advantages over prior art implementations. As will be apparent to one of ordinary skill in the art, other similar arrangements are possible within the general scope. The embodiments and methods described above are intended to be exemplary rather than limiting, and the bounds should be determined from the claims.

We claim:

1. A system, comprising:
a logic software simulator running on a host workstation;
a hardware emulation system having a system bus and an emulator chip, the emulator chip comprising a plurality emulation processor clusters, wherein each emulation processor cluster includes:
a plurality of emulation processors, wherein each emulation processor processes a data signal received at an input port to generate emulation data at an output port, and
a data array comprising a plurality of register arrays or memories, wherein each register array or memory comprises a write port and a read port, wherein the write port is connected to the output port of one of the emulation processors to receive emulation data to write to the register array or memory during an emulation step of a first plurality of emulation steps and is connected to the system bus to receive simulation acceleration data from the logic software simulator to write to the register array or memory during an emulation step of a second plurality of emulation steps, wherein the first plurality of emulation steps alternate with the second plurality of emulation steps, wherein the data array is directly accessible by the host workstation, and wherein the read port is connected to the input port of one of the emulation processors; and
a high-speed interface connecting the host workstation to the system bus of the hardware emulator to write the simulation acceleration data from the host workstation directly to the data array of the emulation processor cluster using the system bus during the emulation of a logic design.

2. The system of claim 1, wherein the high-speed interface is a PCI Express interface.

3. The system of claim 1, wherein the emulator chip includes a holding register for storing emulation data generated by the emulation processor in a previous emulation step.

4. The system of claim 3, wherein the emulator chip includes bypass logic for selecting between outputting from the data array and outputting from the holding register to the emulation processor.

5. The system of claim 1, wherein the emulation data and the simulation acceleration data are written to the data array through a same write port.

6. The system of claim 1, wherein the simulation data are written to the data array during even emulation steps and the emulation data are written to the data array during odd emulation steps.

7. The method of claim 6, wherein the simulation data are written to the data array during alternating even emulation steps.

8. The system of claim 1, wherein the emulation data written to the data array includes emulation data generated by the emulation processor during two previous emulation steps.

9. The system of claim 1, wherein an address range in the data array may be reserved for storing the simulation acceleration data.

10. The system of claim 9, wherein the address range may be reserved by employing an instruction that reads data from an address location and writes the data back to the same address location.

11. The system of claim 9, wherein the address range may be reserved by only scheduling emulations steps that correspond to addresses outside the address range.

12. A method comprising the steps of:
   providing a high-speed interface that connects a host workstation to a system bus on a hardware emulation system, the hardware emulation system includes an emulator chip comprising a plurality of emulation processors arranged in a plurality of emulation processor clusters, wherein each emulation processor cluster has:
   an emulation processor of the plurality of emulation processors,
   a holding register to receive emulation data generated by the emulation processor, and
   a data array comprising a plurality of register arrays or memories, wherein the data array comprises a write port and a read port, wherein the write port is connected to the holding register to receive the emulation data, and connected directly to the system bus, wherein the data array is directly accessible by the host workstation through the system bus, and wherein the read port is connected to an input port of the emulation processor;
   sending simulation acceleration data to the system bus over the high-speed interface;
   storing emulation data generated by the emulation processor into the holding register;
   selecting the simulation acceleration data on the system bus as input into the write port of the data array;
   writing the simulation acceleration data to the data array during an emulation step of a first plurality of emulation steps; and
   writing the emulation data from the holding register to the data array during an emulation step of a second plurality of emulation steps, wherein the second plurality of emulation steps alternate with the first plurality of emulation steps.

13. The method of claim 12, wherein the high-speed interface is a PCI Express interface.

14. The method of claim 12, wherein the emulation data written to the data array includes emulation data generated by the emulation processor during two previous emulation steps.

15. The method of claim 12, further comprising the step of activating bypass logic to output the emulation data stored in the holding register to the emulation processor.

16. The method of claim 12, wherein an address range in the data array may be reserved for storing the simulation acceleration data.

17. The method of claim 16, wherein the address range may be reserved by employing an instruction that reads data from an address location and writes the data back to the same address location.

18. The method of claim 16, wherein the address range may be reserved by only scheduling emulations steps that correspond to addresses outside the address range.

19. The method of claim 12, wherein the simulation data are written to the data array during even emulation steps and the emulation data are written to the data array during odd emulation steps.

20. The method of claim 19, wherein the simulation data are written to the data array during alternating even emulation steps.

* * * * *